(12) United States Patent
Oh (10) Patent No.: US 8,184,483 B2
(45) Date of Patent: May 22, 2012

(54) NONVOLATILE MEMORY DEVICE AND METHOD OF PROGRAMMING THE SAME

(75) Inventor: Seung Min Oh, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 182 days.

(21) Appl. No.: 12/787,769

(22) Filed: May 26, 2010

(65) Prior Publication Data
US 2010/0302860 A1 Dec. 2, 2010

(30) Foreign Application Priority Data

May 29, 2009 (KR) .......................... 10-2009-0047830
Jun. 29, 2009 (KR) .......................... 10-2009-0058494

(51) Int. Cl.
*G11C 16/04* (2006.01)
(52) U.S. Cl. ............. 365/185.19; 365/185.22; 365/49.1; 365/226
(58) Field of Classification Search ............. 365/185.19, 365/185.22, 49.1, 226
See application file for complete search history.

(56) References Cited

U.S. PATENT DOCUMENTS

| | | | |
|---|---|---|---|
| 7,548,464 B2 | 6/2009 | Kim | |
| 7,602,648 B2 | 10/2009 | Lee | |
| 7,898,876 B2 * | 3/2011 | Yang et al. | 365/189.05 |
| 7,903,481 B2 * | 3/2011 | Rho et al. | 365/196 |
| 8,018,775 B2 * | 9/2011 | Oh | 365/185.22 |
| 8,068,360 B2 * | 11/2011 | Anholt | 365/185.03 |

FOREIGN PATENT DOCUMENTS

| KR | 1020070002411 | 1/2007 |
|---|---|---|
| KR | 1020090015276 | 2/2009 |

OTHER PUBLICATIONS

Notice of Allowance issued from Korean Intellectual Property Office on May 31, 2011.

* cited by examiner

*Primary Examiner* — Pho M Luu
(74) *Attorney, Agent, or Firm* — IP & T Group LLP (57) ABSTRACT

A nonvolatile memory device includes a memory cell array, including a first memory cell group configured to store data and a second memory cell group configured to store operation information, including first and second program start voltages, a page buffer unit, including page buffers each configured to store program data for memory cells or store data read from the memory cells, and a control unit configured to, when a program operation is first performed after power is supplied, count a number of program pulses until a verification operation using a first verification voltage is a pass, compare the counted number and a first number of program pulses, select either the first or second program start voltages according to a result of the comparison, and control the program operation to be performed using the selected program start voltage until the power is off.

12 Claims, 8 Drawing Sheets

NONVOLATILE MEMORY DEVICE AND METHOD OF PROGRAMMING THE SAME

CROSS-REFERENCES TO RELATED APPLICATION

This application claims priority from Korean Patent Application No. 10-2009-0047830 filed on May 29, 2009 and Korean Patent Application No. 10-2009-0058494 filed on Jun. 29, 2009, the disclosure of each of which is incorporated herein by reference in their entireties.

BACKGROUND

Exemplary embodiments relate to a method of programming a nonvolatile memory device.

There is an increasing demand for nonvolatile memory devices which can be electrically programmed and erased and can retain data even without the supply of power. To develop high-capacity memory devices capable of storing a large amount of data, technology for the high integration of memory cells is being developed.

Recently, to further increase the degree of integration of memory devices, active research has been performed on a multi-bit cell which is able to store plural data in a single memory cell. This type of a memory cell is called a multi-level cell (MLC). A memory cell capable of storing one bit is called a single level cell (SLC).

Figure 1:
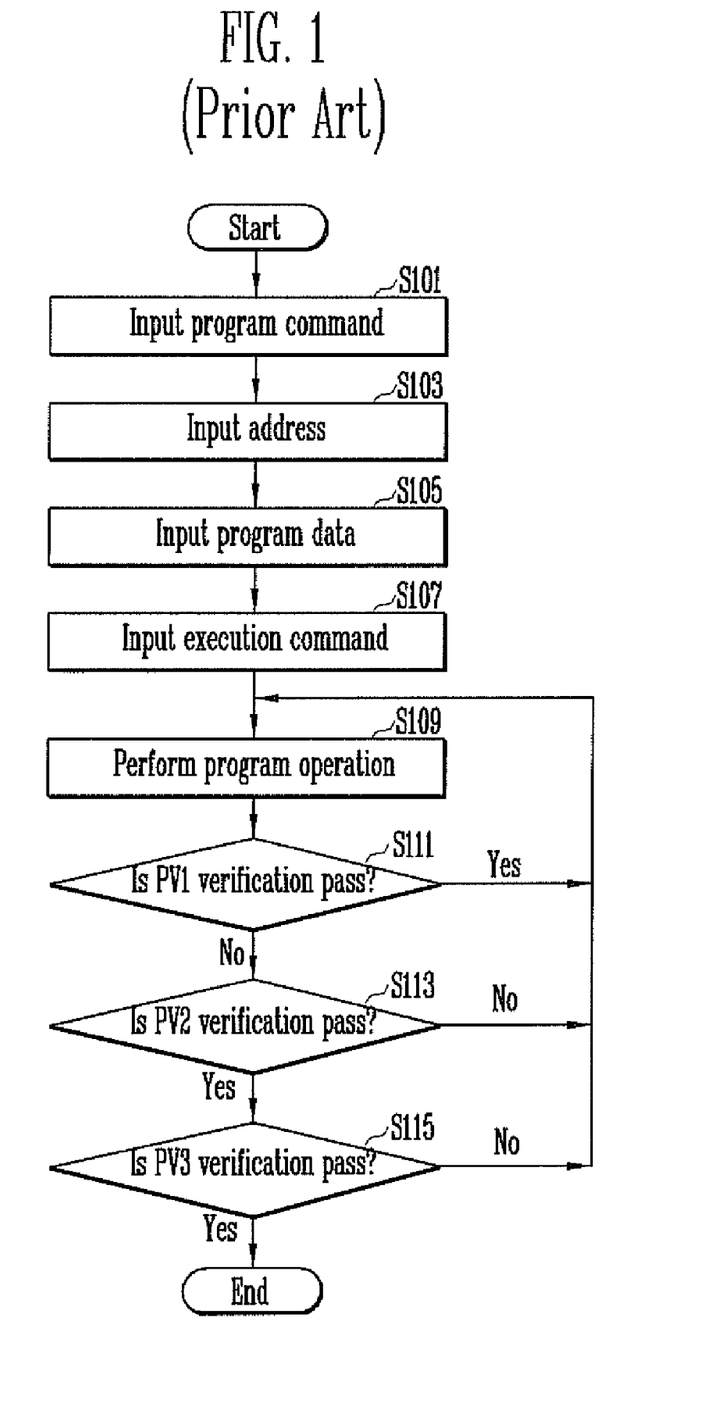
FIG. 1 is a flowchart illustrating a known operation of programming a nonvolatile memory device.

FIG. 1 is a flowchart illustrating a known operation of programming a nonvolatile memory device.

The program operation of FIG. 1 illustrates only a process of performing a most significant bit (MSB) program operation after a least significant bit (LSB) program operation in the nonvolatile memory device, including memory cells each capable of storing data of 2 bits.

Referring to FIG. 1, first, a program command, addresses, and data to be programmed are inputted to a nonvolatile memory device at steps S101, S103, and S105, respectively. An execution command is then inputted to the nonvolatile memory device at step S107.

In response to the execution command, a program operation is performed at step S109, and verification operations using first to third verification voltages PV1 to PV3 are then performed at steps S111 to S115, respectively.

When the program operation is performed, a program voltage Vpgm is supplied to a word line for a program, and the first to third verification operations using the first to third verification voltages PV1 to PV3 are performed.

The program process is finished when all the first to third verification operations are a pass. If the first to third verification operations are not a pass, the program voltage Vpgm is raised, and the program operation is performed again using the raised program voltage Vpgm. Here, the program voltage Vpgm is increased from a program start voltage Vpgm_start by a step voltage according to an increment step program pulse (ISPP) method.

Figure 2:
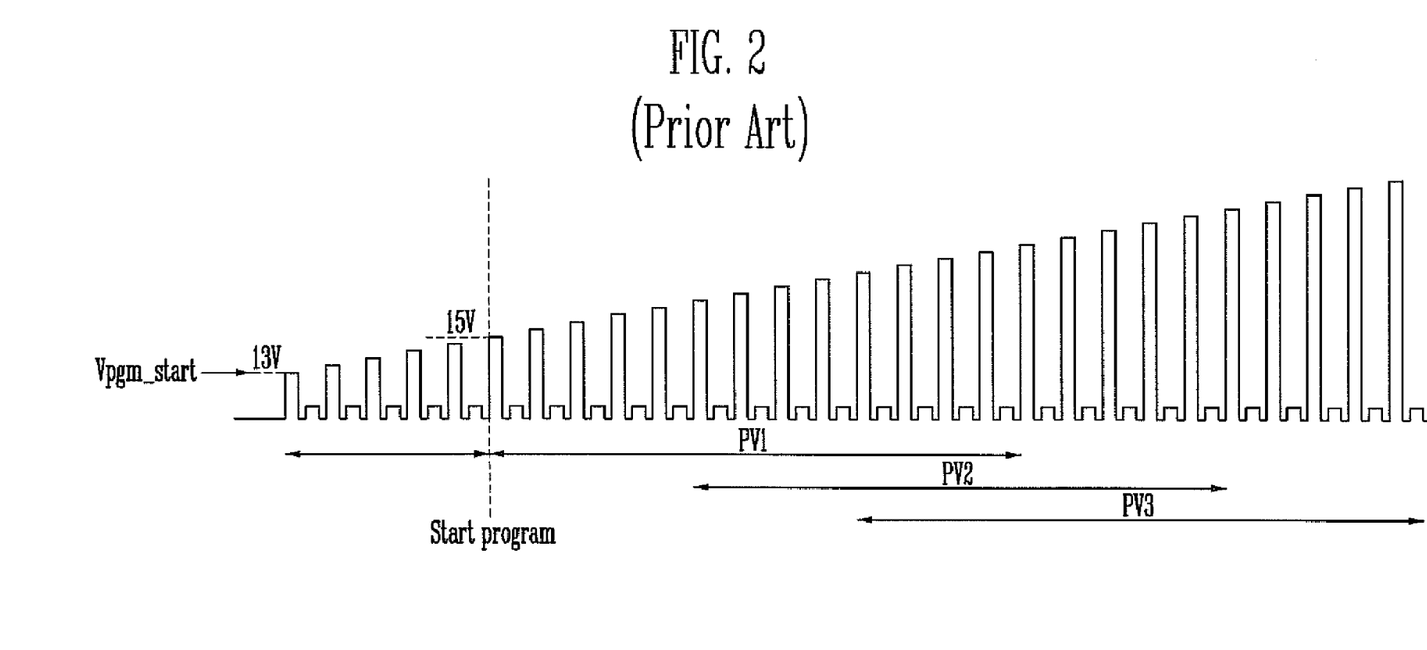
FIG. 2 shows the levels of voltages supplied to a selected word line in response to program pulses.

FIG. 2 shows the levels of voltages supplied to a selected word line in response to program pulses.

Referring to FIG. 2, a program voltage, raised from a program start voltage Vpgm_start by a step voltage, is supplied in response to a program pulse. After the program voltages are supplied, first to third verification voltages PV1 to PV3 are supplied. Here, the first to third verification voltages PV1 to PV3 are not separately shown, but shown as one program verification pulse.

As shown in FIG. 2, the program start voltage Vpgm_start at which the program operation is actually started is 15 V.

During the time when some program pulses are supplied, only the first verification operation PV1 is performed. Next, the second verification operation PV2 and the third verification operation PV3 are performed. This is because, during the time when the program operation is first started in response to some program pulses, the threshold voltages of all memory cells do not rise to the extent that they become a pass for the second and third verification voltages PV2 and PV3.

From FIG. 2, it can be seen that a program voltage of 13 V, which is less than the program voltage supplied when the program operation is actually started, is first supplied. The reason why a program voltage less than a program voltage supplied when a program operation is actually started is first supplied is because the threshold voltage of a memory cell shifts in response to the erase/write cycles of the memory cell.

With an increase in the number of erase/write cycles, electrons are trapped at the memory cell, and so a threshold voltage of the memory cell becomes higher than its initial threshold voltage even after the memory cell is erased. Although a program voltage of 15 V can be first supplied, if the program voltage of 15 V is subsequently supplied, memory cells become over programmed. Therefore, to prevent this problem, a program voltage of 13 V is initially supplied. It can be said that memory cells start to be programmed when the program voltage of 15 V is supplied for the first time. A method of supplying a program voltage as described above is referred to as a blind program method. In other words, during the time when the blind program voltage of 13 V to 15 V is supplied, there is no program effect resulting from the supply of the program voltage. If the number of erase/write cycles is high, a program operation can be normally performed in response to a program voltage starting at 13 V.

BRIEF SUMMARY

Exemplary embodiments relate to a nonvolatile memory device and a method of programming the same, wherein a program start voltage is changed in response to the number of erase/write cycles for a memory cell.

A nonvolatile memory device according to an aspect of the present disclosure includes a memory cell array configured to include a first memory cell group and a second memory cell group, the first memory cell group being coupled to bit lines and word lines and configured to store data, and the second memory cell group being configured to store operation information including first and second program start voltages, a page buffer unit configured to comprise page buffers, each being coupled to one or more of the bit lines and configured to temporarily store data to be programmed into memory cells or to store data read from the memory cells; and a control unit configured to, when a program operation is first performed after power is supplied, count a number of program pulses until a verification operation using a first verification voltage is a pass, compare the counted number of program pulses and a first number of program pulses included in the operation information, select any one of the first and second program start voltages according to a result of the comparison, and control the program operation to be performed using the selected program start voltage until the power is off.

Further, the control unit may include a counter configured to count the number of program pulses until the verification operation using the first verification voltage is a pass, a comparator configured to compare the counted number of program pulses and the first number of program pulses, and to output a first flag signal according to a result of the comparison, and a MUX configured to select one of the first and second program start voltages in response to the first flag signal, and to output the selected program start voltage and a second flag signal in response to the selected program start voltage.

The counter and the comparator may stop operating in response to the second flag signal.

The first program start voltage may be set by default and applied to a program operation when the nonvolatile memory device is first started.

The control unit may change the selected program start voltage from the first program start voltage to the second program start voltage when the counted number of program pulses is less than the first number of program pulses.

The first program start voltage may be a higher voltage level than the second program start voltage.

A method of operating a nonvolatile memory device according to another aspect of the present disclosure includes performing a program operation by supplying a program voltage starting with a first program start voltage, and storing operation information, including a first number of program pulses when a verification operation using a first verification voltage is a pass, the first program start voltage, and a second program start voltage, inputting power to the nonvolatile memory device, and loading the operation information, determining whether a program command received after the power is supplied is received for the first time, and if, as a result of the determination, the received program command is determined to be received for the first time, performing the program operation by supplying a program voltage starting with the first program start voltage, and counting the number of program pulses until the verification operation using the first verification voltage is a pass, and comparing the counted number of program pulses and the first number of program pulses, and selecting one of the first and second program start voltages as a program start voltage according to a result of the comparison.

If, as a result of the determination, the received program command is determined not to be received for the first time, the program operation is performed by supplying the program voltage starting with the selected program start voltage, and the number of program pulses is not counted.

The first program start voltage may have a higher voltage level than the second program start voltage.

If, as a result of the comparison, the counted number of program pulses is less than the first number of program pulses, the second program start voltage is selected as the program start voltage.

DESCRIPTION OF EMBODIMENTS

Hereinafter, exemplary embodiments of the present disclosure will be described in detail with reference to the accompanying drawings. The figures are provided to allow those having ordinary skill in the art to understand the scope of the exemplary embodiments of the disclosure.

Figure 3A:
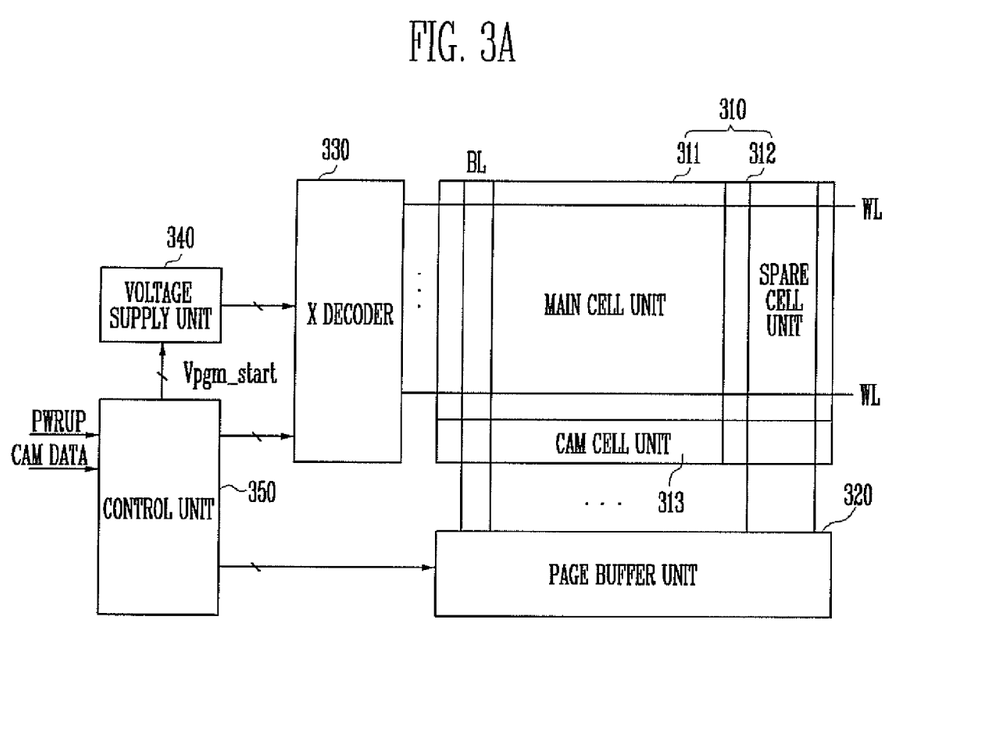
FIG. 3A is a diagram showing a nonvolatile memory device according to an embodiment of the present disclosure.

FIG. 3A is a diagram showing a nonvolatile memory device according to an embodiment of the present disclosure.

Referring to FIG. 3A, the nonvolatile memory device according to the embodiment of the present disclosure includes a memory cell array 310, a page buffer unit 320, an X decoder 330, a voltage supply unit 340, and a control unit 350.

The memory cell array 310 includes a main cell unit 311 and a space cell unit 312. The memory cell array 310 further includes a code address memory (CAM) cell unit 313, including CAM cells for storing operation information.

The main cell unit 311 includes memory cells for storing data. The spare cell unit 312 includes redundant memory cells which will replace fail memory cells included in the main cell unit 311.

Further, the memory cells may be grouped into memory blocks.

The page buffer unit 320 includes page buffers. Each of the page buffers is configured to receive external data to be programmed into a selected memory cell and to temporarily store the program data, or to read data programmed into a selected memory cell and temporarily store the read data.

The X decoder 330 is configured to select a memory block from the memory cell array 310 and to enable the selected memory block. The X decoder 330 is configured to couple the enabled memory block to global lines for supplying voltages for program operations or read operations.

The voltage supply unit 340 is configured to supply the X decoder 330 with the voltages for program operations or read operations.

The control unit 350 is configured to count and store the number of program pulses that are inputted to the nonvolatile memory device until a program operation using a first verification voltage PV1 becomes a pass. The control unit 350 is configured to compare the stored number of program pulses and the number of program pulses counted when the program operation using the first verification voltage PV1 is a pass with an increase in the number of erase/write cycles, and to determine a program start voltage Vpgm_start based on a result of the comparison.

Figure 3B:
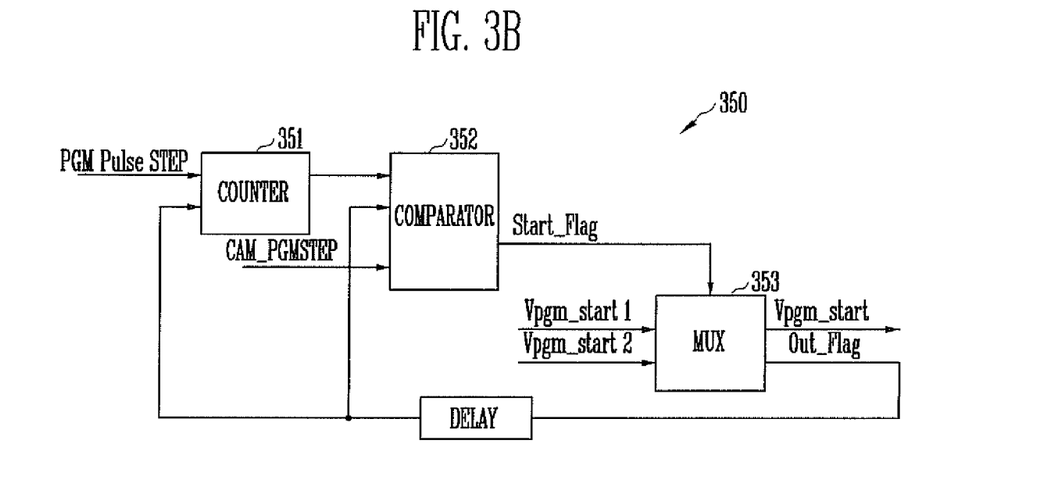
FIG. 3B is a block diagram of a control unit shown in FIG. 3A.

FIG. 3B is a block diagram of the control unit 350 shown in FIG. 3A.

Referring to FIG. 3B, the control unit 350 of the nonvolatile memory device includes a counter 351, a comparator 352, and a MUX 353.

The counter 351 is configured to count the number of program pulses supplied thereto. The comparator 352 is configured to compare the first number of program pulses CAM_PGMSTEP, previously stored by performing a test, and the second number of program pulses counted, and to output a result of the comparison as a first flag signal Start_Flag. The MUX 353 is configured to select one of two or more voltages (e.g., Vpgm_start1 and Vpgm_start2) received in response to the first flag signal Start_Flag, and to output a selected voltage as a program start voltage Vpgm_start.

Here, the first number of program pulses CAM_PGM-STEP is counted by performing a test when the nonvolatile memory device is first used, and is then stored in a corresponding CAM cell.

Voltages inputted to the MUX 353 can include the first program start voltage Vpgm_start1 and the second program start voltage Vpgm_start2. The first program start voltage Vpgm_start1 is a start voltage supplied when a program operation for the nonvolatile memory device is first started. The second program start voltage Vpgm_start2 is a start voltage that is supplied when the threshold voltage of a memory cell is raised after a certain number of erase/write cycles. The first program start voltage Vpgm_start1 is higher than the second program start voltage Vpgm_start2. Information about the first and second program start voltages Vpgm_start1 and Vpgm_start2 is stored in a corresponding CAM cell.

After outputting the program start voltage Vpgm_start, the MUX 353 outputs a second flag signal Out_Flag, indicating that the program start voltage Vpgm_start has been set in order to avoid performing the comparison of program pulses after the power is turned off and until the power is turned on again.

The second flag signal Out_Flag is delayed within the system for a certain period of time, and then sent to the counter 351 and the comparator 352. The delay time may vary according to the nonvolatile memory device. The second flag signal Out_Flag is delayed and inputted to the counter 351 and the comparator 352, and it does not affect the next operation.

The counter 351 and the comparator 352 to which the second flag signal Out_Flag has been inputted do not perform a count or comparison operation. Accordingly, the program start voltage Vpgm_start that has been set is used without change after the power is turned off and until power is turned on again.

The process in which the control unit 350 changes the program start voltage Vpgm_start is described in more detail below.

Figure 4:
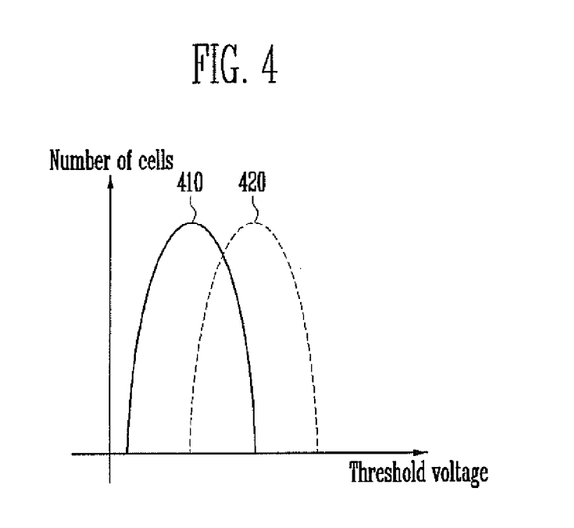
FIG. 4 is a diagram showing a shift in a distribution of a threshold voltage according to the number of erase/write cycles for a nonvolatile memory device.

FIG. 4 is a diagram showing a shift in a distribution of a threshold voltage according to the number of erase/write cycles for a nonvolatile memory device.

Referring to FIG. 4, memory cells programmed to have a first distribution 410 of a threshold voltage can be over programmed with an increase in the number of erase/write cycles, and as a result, may form a second distribution 420 of the threshold voltage. Accordingly, if the program start voltage Vpgm_start supplied when a program operation is first started is set high and is fixed, a threshold voltage of a memory cell rises with an increase in the number of erase/write cycles, leading to over-programming.

To prevent this problem, a method of changing the program start voltage Vpgm_start according to one or more embodiments of the present disclosure is described below.

Figure 5:
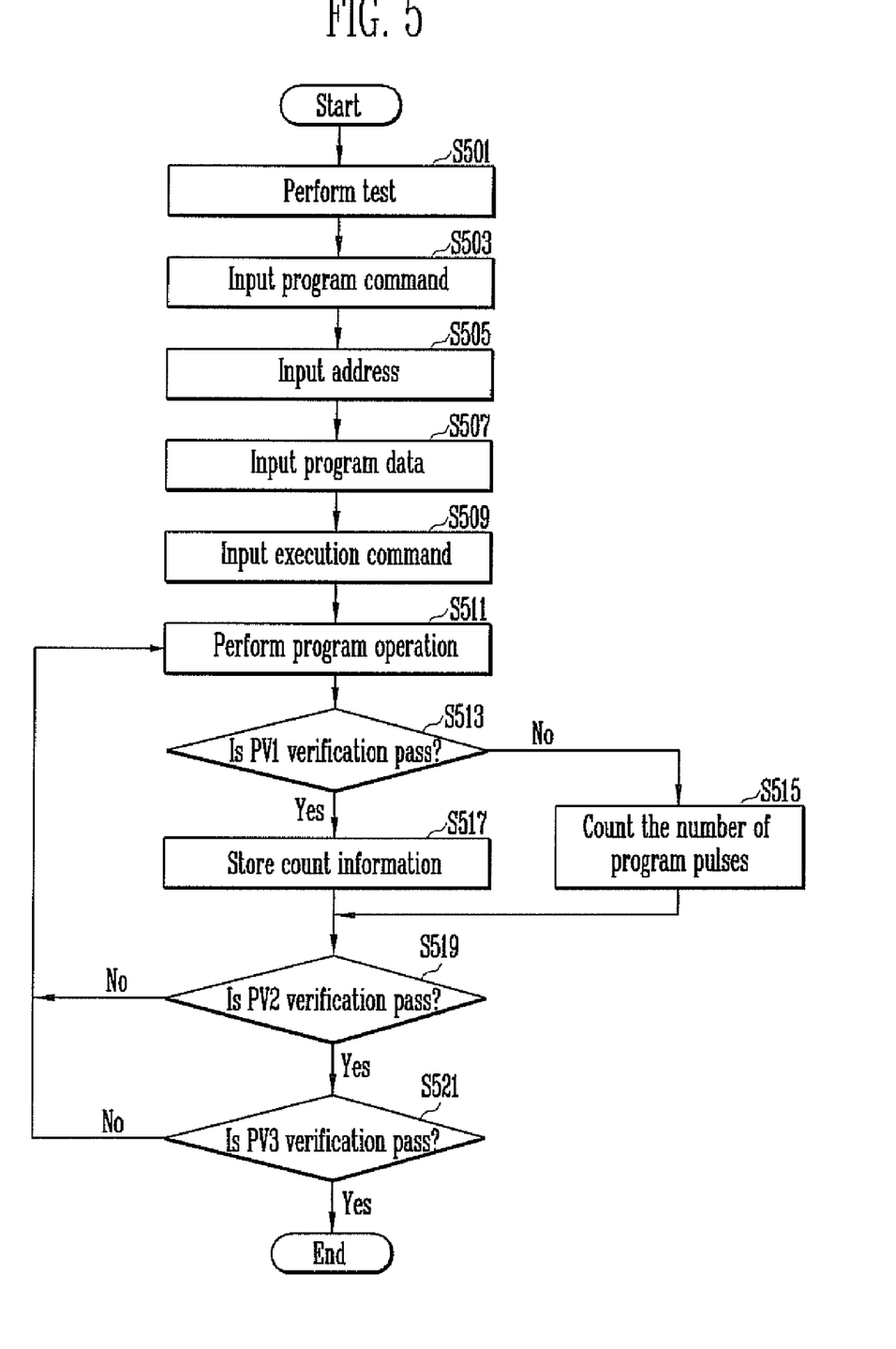
FIG. 5 is a flowchart illustrating an operation of storing the number of initial program pulses according to an embodiment of the present disclosure.

FIG. 5 is a flowchart illustrating an operation of storing the number of initial program pulses according to an embodiment of the present disclosure.

This figure illustrates an operation of storing, in a corresponding CAM cell, the number of program pulses when an initial test operation for the nonvolatile memory device of this disclosure using a first verification voltage PV1 is a pass. In the case in which the nonvolatile memory device includes MLCs each capable of storing data of 2 bits, when a most significant bit (MSB) program operation is performed after a least significant bit (LSB) program operation, first to third verification operations respectively using first to third verification voltages PV1 to PV3 are performed.

In the embodiment of the present disclosure, the number of program pulses counted until the first verification operation using the first verification voltage PV1 is a pass is stored.

Referring to FIG. 5, when a test is started at step S501, a program command, addresses, and data to be programmed are inputted at steps S503, 5505, and S507, respectively. Next, an execution command is inputted at step S509, Here, the program command, the addresses, the data, and the execution command may not be inputted externally during the test operation, but may be automatically inputted by a test-related apparatus.

In response to the execution command, a program operation is performed at step S511. More precisely, a most significant bit (MSB) page program is performed, and a program voltage is started from a program start voltage Vpgm_start, which has been set by default.

The program start voltage Vpgm_start set by default corresponds to a voltage used to normally start the program operation when the erase/write cycles are not performed. For example, here, it is assumed that the program start voltage Vpgm_start set by default is about 15 V. Further, with reference to FIG. 3B, the program start voltage Vpgm_start of 15 V is selected as the first program start voltage Vpgm_start1.

When the program operation is performed, a program voltage is supplied starting with the program start voltage Vpgm_start of 15 V. After a program operation is performed in response to a first program pulse, it is determined whether the first verification operation for the program operation is a pass at step S513.

If, as a result of the determination, the first verification operation is determined to be a pass, then at step S517 count information (for example, '1') is stored in a corresponding CAM cell because the first program pulse has been supplied. However, if, as a result of the determination, the first verification operation is determined not to be a pass, the number of program pulses is counted at step S515. Next, after either performing step S515 or step S517, it is determined whether the second and third verifications operations respectively using the second and third verification voltages are a pass at steps S519 and S521, respectively. Here, the second and third verification operations may be performed in response to the first program pulse or may be performed in response to a set program pulse.

In the embodiment of the present disclosure, it is assumed that, after a program operation in response to a seventh program pulse is performed, the first verification operation becomes a pass. Accordingly, the count information '7' is stored in the CAM cell.

The CAM cell includes operation information necessary to operate the nonvolatile memory device, information about operation voltages, etc. In the embodiment of the present disclosure, it is assumed that the first program start voltage Vpgm_start1 and the second program start voltage Vpgm_start2 are stored in the CAM cell, and information about the number of program pulses at which the first verification operation becomes a pass through a test shown in FIG. 5 is stored as '7'.

Whenever the nonvolatile memory device is actually powered and driven, the number of program pulses at which the first verification operation becomes a pass is checked, and the checked number of program pulses is compared with the stored number of program pulses (for example, '7'). Thus, one of the first and second program start voltages Vpgm_start1 and Vpgm_start2 may be selectively used according to a result of the comparison.

Figure 6A:
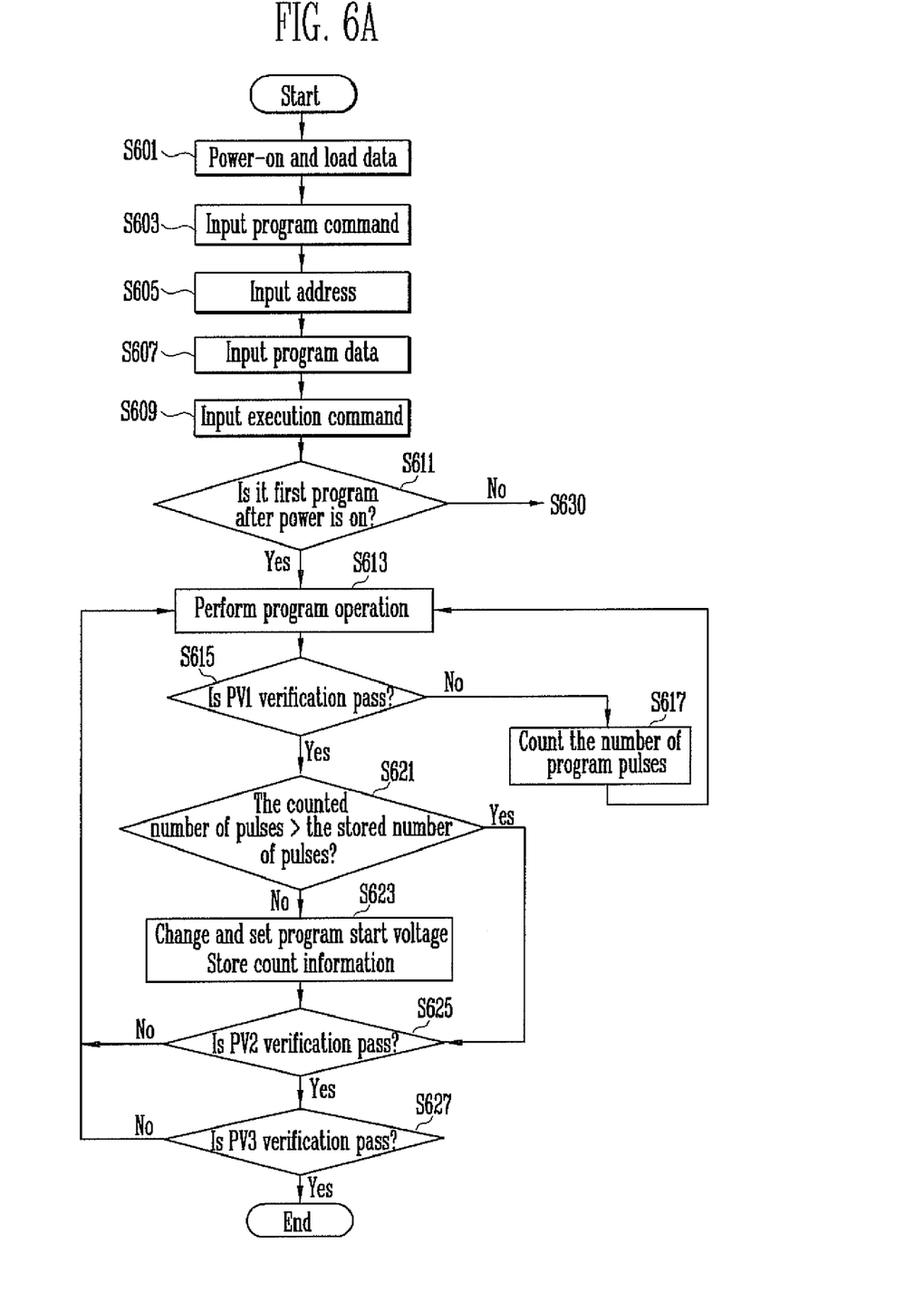
FIG. 6A is a flowchart illustrating a program operation according to an embodiment of the present disclosure.

FIG. 6A is a flowchart illustrating a program operation according to an embodiment of the present disclosure.

Referring to FIG. 6A, when power is supplied to the nonvolatile memory device according to the embodiment of the present disclosure, a reset operation is performed and operation information, stored in a CAM cell, is loaded at step S601.

A program command, address information, and data to be programmed are inputted to the nonvolatile memory device at steps S603, S605, and S607, respectively. Next, when an execution command is inputted to the nonvolatile memory device at step S609, it is determined whether the inputted program command has been inputted for the first time after the power is supplied at step S611.

If, as a result of the determination, the inputted program command is determined to have been inputted for the first time after the power is supplied, a program operation is performed at step S613. It is then determined whether a first verification operation for the program operation is a pass at step S615. If, as a result of the determination, the first verification operation for the program operation is determined not to be a pass, the number of program pulses is counted at step S617, and the process then returns to step S613.

If, as a result of the determination at step S615, the first verification operation for the program operation is determined to be a pass, it is determined whether the number of program pulses counted so far is more than the number of program pulses stored in the CAM cell, as described with reference to FIG. 5, at step S621. As described above, the number of program pulses stored in the CAM cell is the first number of program pulses CAM_PGMSTEP, and the number of program pulses counted so far is the second number of program pulses.

The above comparison between the number of program pulses counted and the number of program pulses stored in the CAM cell is performed by the control unit 350.

The counter 351 counts the number of program pulses and transfers the counted number (i.e., the second number of program pulses) to the comparator 352 when the first verification operation for the program operation is a pass.

The comparator 352 compares the first number of program pulses CAM_PGMSTEP, loaded in the reset process at step S601 and stored in the CAM cell, and the second number of program pulses. If, as a result of the determination, the first number of program pulses CAM_PGMSTEP is less than the second number of program pulses, the comparator 352 outputs the first flag signal Start_Flag of a low logic level. However, if, as a result of the determination, the first number of program pulses CAM_PGMSTEP is the second number of program pulses or more, the comparator 352 outputs the first flag signal Start_Flag of a high logic level.

In response to the first flag signal Start_Flag of a low logic level, the MUX 353 outputs the first program start voltage Vpgm_start1 as the program start voltage Vpgm_start.

Alternatively, in response to the first flag signal Start_Flag of a high logic level, the MUX 353 outputs the second program start voltage Vpgm_start2 as the program start voltage Vpgm_start.

Furthermore, the MUX 353 outputs the program start voltage Vpgm_start and the second flag signal Out_Flag at the same time.

The operations of the counter 351 and the comparator 352 are stopped in response to the second flag signal Out_Flag.

Here, if the first number of program pulses CAM_PGMSTEP is less than the second number of program pulses, it is meant that the number of erase/write cycles is low. A low number of erase/write cycles means that lots of program and erase operations have not been repeatedly performed on the memory cell array 310. Therefore, it can be determined that the threshold voltage of a corresponding memory cell has not risen to the extent that the memory cell is over programmed. Accordingly, the first program start voltage Vpgm_start is outputted as the program start voltage Vpgm_start, but the first program start voltage Vpgm_start has already been set as the program start voltage.

The second and third verification operations respectively using the second and third verification voltages are performed at steps S625 and S627.

However, if as a result of the determination at step S621, the first number of program pulses CAM_PGMSTEP is the second number of program pulses or more, it is meant that the number of erase/write cycles is high. A high number of erase/write cycles means that lots of program and erase operations have been repeatedly performed on the memory cell array 310. Accordingly, if the program operation is performed using the existing program start voltage, the corresponding memory cell can be over programmed because the threshold voltage of the memory cell has risen.

To prevent such over-programming, the program start voltage Vpgm_start is changed from the first program start voltage Vpgm_start1 to the second program start voltage Vpgm_start2 at step S623.

Next, the second and third verification operations respectively using the second and third verification voltages are performed at steps S625 and S627. If the first to third verification operations are all a pass, the program operation is completed.

Meanwhile, if, after the program start voltage Vpgm_start is changed at step S623, a program command is received, it is determined that the received program command is not the first program command after the supply of power at step 5611.

In this case, a process of performing a program operation is performed at step 5630.

Figure 6B:
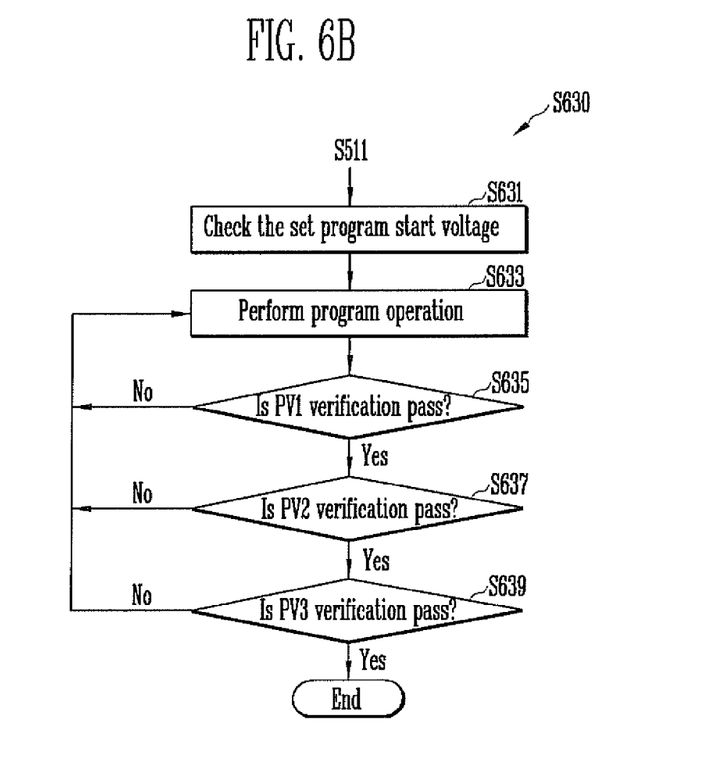
FIG. 6B is a flowchart of the step S630 shown in FIG. 6A.

FIG. 6B is a flowchart of the step S630 shown in FIG. 6A.

Referring to FIG. 6B, the changed program start voltage Vpgm_start is checked at step S631. A program operation and first to third verification operations for the program operation are performed using the program start voltage Vpgm_start at steps S633, 5635, S637, and S639.

If the number of erase/write cycles is high and the threshold voltage of the memory cell rises, the control unit 350 changes the program start voltage Vpgm_start from the first program start voltage Vpgm_start1 to the second program start voltage Vpgm_start2.

Figure 7:
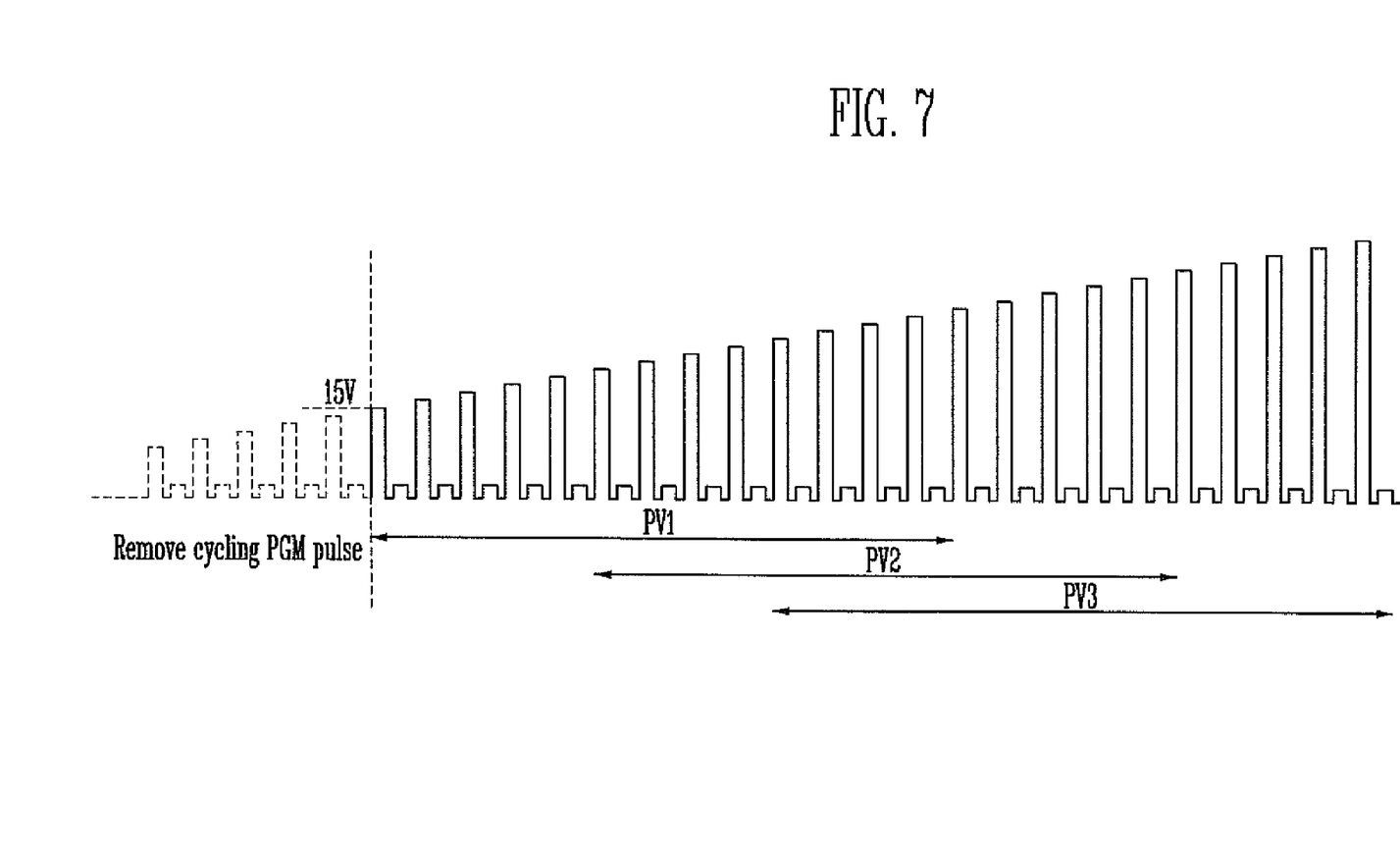
FIG. 7 shows the levels of program voltages supplied in response to program pulses when the number of erase/write cycles is low according to an embodiment of the present disclosure.

FIG. 7 shows the levels of program voltages supplied in response to program pulses when the number of erase/write cycles is low according to an embodiment of the present disclosure.

Referring to FIG. 7, in the state in which the number of erase/write cycles is not high, the first program voltage Vpgm_start1. is selected as a program start voltage Vpgm_start, and a program voltage is then supplied. Thus, it is not necessary to supply a blind program pulse from the beginning in anticipation of over-programming occurring when the number of erase/write cycles is increased. Accordingly, the time that it takes to perform a program operation can be reduced.

As described above, according to the nonvolatile memory device and the method of programming the same in accordance with the present disclosure, with an increase in the number of erase/write cycles for a memory cell, a distribution of a threshold voltage of the memory cell is checked, and a program start voltage is changed according to a result of the check. Accordingly, the time that it takes to perform a program operation can be reduced because a blind program method is not used. Further, an over-programming problem is not generated according to a program state of the memory cell.

What is claimed is:

1. A nonvolatile memory device, comprising:
a memory cell array configured to comprise a first memory cell group and a second memory cell group, the first memory cell group being coupled to bit lines and word lines and configured to store data, and the second memory cell group being configured to store operation information comprising first and second program start voltages;
a page buffer unit configured to comprise page buffers, each being coupled to one or more of the bit lines and configured to temporarily store data to be programmed into memory cells or to store data read from the memory cells; and
a control unit configured to, when a program operation is first performed after power is supplied, count a number of program pulses until a verification operation using a first verification voltage is a pass, compare the counted number of program pulses and a first number of program pulses included in the operation information, select any one of the first and second program start voltages according to a result of the comparison, and control the program operation to be performed using the selected program start voltage until the power is off.

2. The nonvolatile memory device of claim 1, wherein the control unit comprises:
a counter configured to count the number of program pulses until the verification operation using the first verification voltage is a pass;
a comparator configured to compare the counted number of program pulses and the first number of program pulses, and to output a first flag signal according to a result of the comparison; and
a MUX configured to select one of the first and second program start voltages in response to the first flag signal, and to output the selected program start voltage and a second flag signal in response to the selected program start voltage.

3. The nonvolatile memory device of claim 2, wherein the counter and the comparator stop operating in response to the second flag signal.

4. The nonvolatile memory device of claim 1, wherein the first program start voltage is set by default and applied to a program operation when the nonvolatile memory device is first started.

5. The nonvolatile memory device of claim 4, wherein the control unit changes the selected program start voltage from the first program start voltage to the second program start voltage when the counted number of program pulses is less than the first number of program pulses.

6. The nonvolatile memory device of claim 5, wherein the first program start voltage has a higher voltage level than the second program start voltage.

7. A method of operating a nonvolatile memory device, the method comprising:
performing a program operation by supplying a program voltage starting with a first program start voltage, and storing operation information, including a first number of program pulses when a verification operation using a first verification voltage is a pass, the first program start voltage, and a second program start voltage;
inputting power to the nonvolatile memory device, and loading the operation information;
determining whether a program command received after the power is supplied is received for the first time, and if, as a result of the determination, the received program command is determined to be received for the first time, performing the program operation by supplying a program voltage starting with the first program start voltage, and counting a number of program pulses until the verification operation using the first verification voltage is a pass; and
comparing the counted number of program pulses and the first number of program pulses, and selecting one of the first and second program start voltages as a program start voltage according to a result of the comparison.

8. The method of claim 7, wherein, if, as a result of the determination, the received program command is determined not to be received for the first time, the program operation is performed by supplying the program voltage starting with the selected program start voltage, and the number of program pulses is not counted.

9. The method of claim 7, wherein the first program start voltage has a higher voltage level than the second program start voltage.

10. The method of claim 9, wherein, if, as a result of the comparison, the counted number of program pulses is less than the first number of program pulses, the second program start voltage is selected as the program start voltage.

11. A semiconductor memory device, comprising memory cells for a program and page buffers for temporarily storing data to be programmed in the memory cells or reading data stored in the memory cells and temporarily storing the read data, the semiconductor memory device comprising:
a CAM cell unit configured to store operation information, including first and second program start voltages, and first program pulse information which is a number of program pulses counted until a first verification operation using a first verification voltage is a pass during a program operation first performed after a power source is inputted; and
a control unit configured to select one of the first and second program start voltages based on the stored first program pulse information and control the program operation so that the program operation is performed, when the memory cells are programmed.

12. A method of programming a semiconductor memory device, the method comprising:
during a program operation which is first performed in response to a program command after a power source is inputted, counting a number of program pulses supplied until a first verification operation using a first verification voltage is a pass, and storing the counted number of program pulses as first program pulse information;
setting a program start voltage based on the stored first program pulse information; and
during a program operation which is performed in response to a program command after the first program operation, supplying a program voltage in accordance with an ISPP method based on the set program start voltage.

* * * * *